(12) United States Patent
Ahrens et al.

(10) Patent No.: US 9,448,283 B2
(45) Date of Patent: Sep. 20, 2016

(54) CIRCUIT ARRANGEMENT FOR LOGIC BUILT-IN SELF-TEST OF A SEMICONDUCTOR DEVICE AND A METHOD OF OPERATING SUCH CIRCUIT ARRANGEMENT

(75) Inventors: Heiko Ahrens, Munich (DE); Claudia Latzel, Putzbrunn (DE); Bernhard Richter, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 115 days.

(21) Appl. No.: 14/421,889

(22) PCT Filed: Aug. 22, 2012

(86) PCT No.: PCT/IB2012/054244
§ 371 (c)(1),
(2), (4) Date: Feb. 16, 2015

(87) PCT Pub. No.: WO2014/030034
PCT Pub. Date: Feb. 27, 2014

(65) Prior Publication Data
US 2015/0219717 A1 Aug. 6, 2015

(51) Int. Cl.
*G01R 31/28* (2006.01)
*G01R 31/3177* (2006.01)
*G01R 31/3185* (2006.01)
*G01R 31/3187* (2006.01)

(52) U.S. Cl.
CPC ....... *G01R 31/3177* (2013.01); *G01R 31/3187* (2013.01); *G01R 31/318547* (2013.01); *G01R 31/318575* (2013.01)

(58) Field of Classification Search
CPC .......... G01R 31/3177; G01R 31/3187; G01R 31/318547; G01R 31/318575
See application file for complete search history.

(56) References Cited

U.S. PATENT DOCUMENTS

| 6,115,827 | A | 9/2000 | Nadeau-Dostie et al. |
| 6,966,021 | B2 | 11/2005 | Rajski et al. |
| 2004/0062135 | A1 | 4/2004 | Itakura |
| 2004/0103355 | A1 | 5/2004 | Correale et al. |
| 2009/0063917 | A1 | 3/2009 | Tokunaga et al. |
| 2010/0107026 | A1 | 4/2010 | Nakamura |

OTHER PUBLICATIONS

International Search Report and Written Opinion correlating to PCT/IB2012/054244 dated Mar. 25, 2013.

(Continued)

*Primary Examiner* — April Y Blair
*Assistant Examiner* — Thien D Nguyen

(57) ABSTRACT

A circuit arrangement for Logic Built-In Self-Test (LBIST) includes a clock source configured to generate a system clock, a first clock division circuitry configured to derive a first punched-out clock and a plurality of scan chains operable at the first punched-out clock. Each scan chain has an associated output circuitry responsive to a leading edge of the first punched-out clock. The circuit arrangement includes a second clock division circuitry configured to derive a second punched-out clock. The second punched-out clock has a delay of one or more system clock periods relative to the first punched-out clock. A compacting logic is configured to compact signals received from the scan chains. A sequential retiming element connects the compacting logic to an input circuitry of a MISR. The sequential retiming element is responsive to a trailing edge of the second punched-out clock. The input circuitry is responsive to a leading edge of the second punched-out clock.

17 Claims, 7 Drawing Sheets

(56) References Cited

OTHER PUBLICATIONS

Wang, Laung-Terng et al: "At-Speed Logic BIST Architecture for Multi-Clock Designs" Proceedings of the 2005 International Conference on Computer Design (ICCD'05), IEEE, Oct. 2-5, 2005, pp. 475-478.

Cheon B. et al: "At-Speed Logic BIST for IP Cores", Proceedings of the Design, Automation and Test in Europe Conference and Exhibition (DATE'05), The Computer Society, IEEE, Mar. 7-11, 2005, pp. 860-861, vol. 2.

US 9,448,283 B2

CIRCUIT ARRANGEMENT FOR LOGIC BUILT-IN SELF-TEST OF A SEMICONDUCTOR DEVICE AND A METHOD OF OPERATING SUCH CIRCUIT ARRANGEMENT

FIELD OF THE INVENTION

This invention relates to a circuit arrangement for Logic Built-In Self-Test of a semiconductor device and a method of operating such circuit arrangement.

BACKGROUND OF THE INVENTION

Schemes for Built-In Self-Test (BIST) of semiconductor devices having digital circuitry may be based on, inside the semiconductor device itself, generating a test stimulus, letting functional circuits of the semiconductor device operate on the test stimulus to obtain responses, collecting the responses and analysing the responses. The test stimulus may be generated by a pseudo-random pattern generator (PRPG). The responses may be collected in a Multi-Input Signature Register (MISR) where a so-called signature is calculated from the responses. Hereto, multiple scan chains may be connected between the pseudo-random pattern generator (PRPG) and the Multi-Input Signature Register (MISR) for shifting test data of the test stimulus into the circuitry under test in a so-called scan phase, to hereby load the multiple scan chains with the test data. Each scan chain is associated with one of multiple functional partitions of the semiconductor devices. After the loading is completed, the partitions operate in their functional context based on the loaded test data in a so-called capture phase. The response of the partitions to the loaded test data is captured in the associated scan chains. Subsequently, all responses are shifted out of the scan chain into a compacting logic, typically by using an exclusive-OR over several responses, and the signature is calculated using a Multi-Input Signature Register (MISR). The signature may then be made available for further analysis, such as comparison with a reference signature associated with expected responses to determine whether the digital circuitry behaved fault-free. The shifting of test data into the circuitry and the shifting of responses out of the scan chain may be done simultaneously. A Built-In Self-Test (BIST) of a digital circuitry may also be referred to as Logic Built-In Self-Test (LBIST). The scan phase may also be referred to as shift phase.

The functional partitions may be configured to operate at different operation frequencies during normal operation of the semiconductor device. These different operation frequencies may further be referred to as functional frequencies. In the capture phase, all functional partitions may operate at their associated operation frequencies, allowing at-speed testing of the functional partitions. An example of a BIST scheme is given in, e.g., U.S. Pat. No. 6,966,021 B2.

The scan phase may use a common shift frequency for all scan chains. The scan phase may use a shift frequency that is different from the functional clock frequencies. The scan phase may in particular use a shift frequency that is lower than the fastest functional clock, for example to reduce the power consumption of the scan phase.

The scan phase may in particular use a shift clock that is established as a divided down version of the fastest functional clock by periodically suppressing one or more successive clock pulses of the fastest functional clock to obtain a so-called punched-out clock. Hereby, a shift clock is obtained with a pulse duration equal to the pulse duration of the fastest functional clock and a cycle time corresponding to a plurality of cycle times of the fastest functional clock. For example, every second, third and fourth clock pulse of four successive clock pulses of the fastest functional clock may be periodically suppressed to obtain a punched-out clock having the same pulse duration as the fastest functional clock but a four times longer cycle time, i.e., a four times lower frequency. The fastest functional clock may, e.g., have a 200 MHz frequency, corresponding to a 2.5 ns clock pulse and a 5.0 ns clock cycle time, and an associated 50 MHz punched-out clock may have the same 2.5 ns clock pulse at a 20.0 ns clock cycle time.

Scan chains associated with functional partitions of different clock domains may be driven with the same punched-out clock, with at least the last flip-flop of each of the scan chains being reactive on the positive edge of the punched-out clock. Physical effects may however result in some non-zero clock skew between the different scan chains, for example resulting from different insertion delays due to synthesizing the scan chains in clock domains of different speed. Hereto, a retiming element, such as a negative-edge triggered flip-flop, may be provided between the scan chains and the MISR to provide a stable data stream, which may be passed on further to a positive-edge triggered flip-flop at the input of the Multi-Input Signature Register (MISR).

Punched-out clocks may also be used in different applications with multiple clock domains, especially where a low-speed clock domain has a clock cycle time that is a multiple of the clock cycle time of a high-speed clock domain.

SUMMARY OF THE INVENTION

The present invention provides a circuit arrangement for Logic Built-In Self-Test of a semiconductor device, a semiconductor device comprising such circuit arrangement, a method of operating such circuit, and a computer program product as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
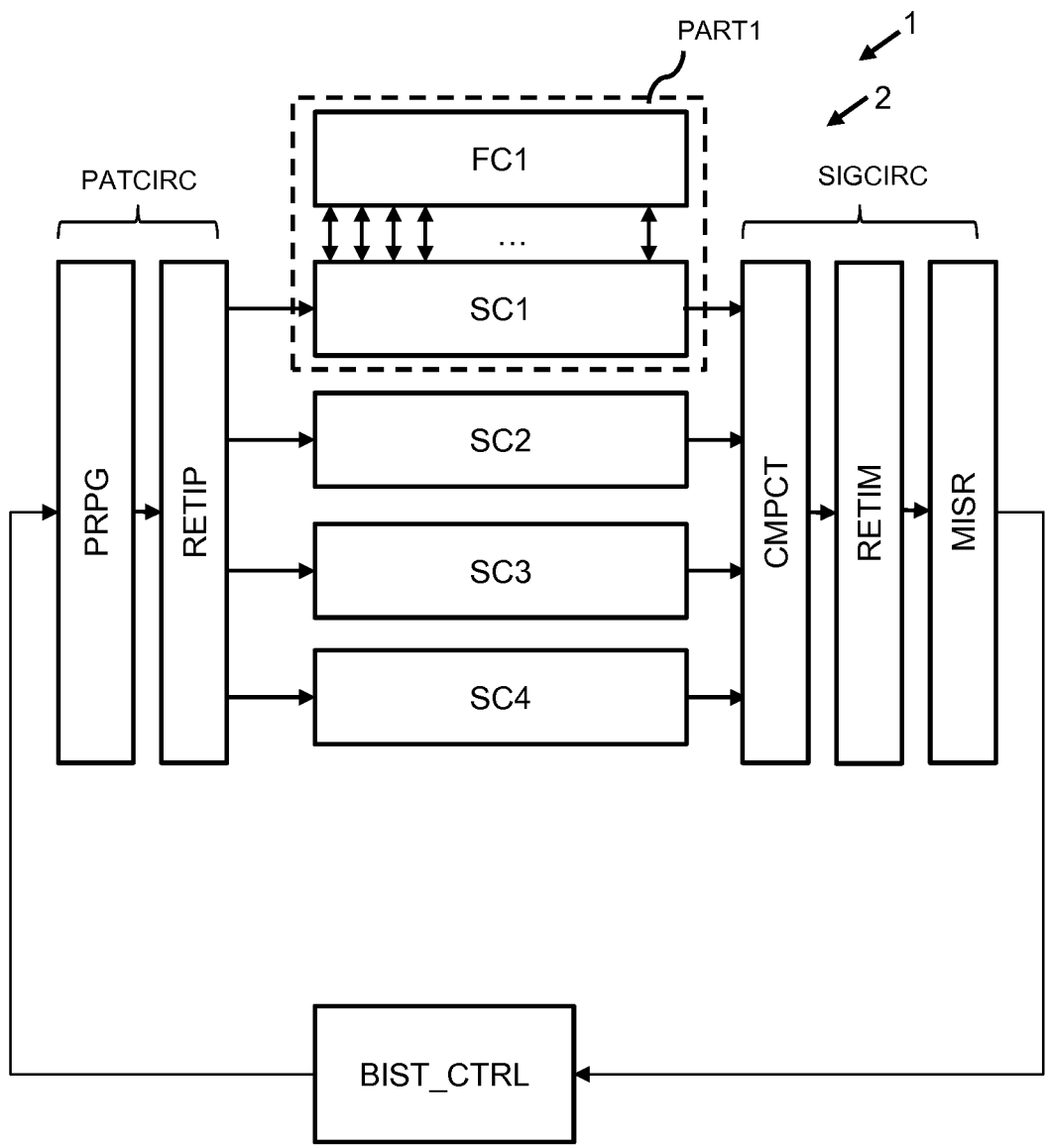
FIG. 1 and FIG. 2 schematically show an example of an embodiment of a semiconductor device and a circuit arrangement.
Figure 2:
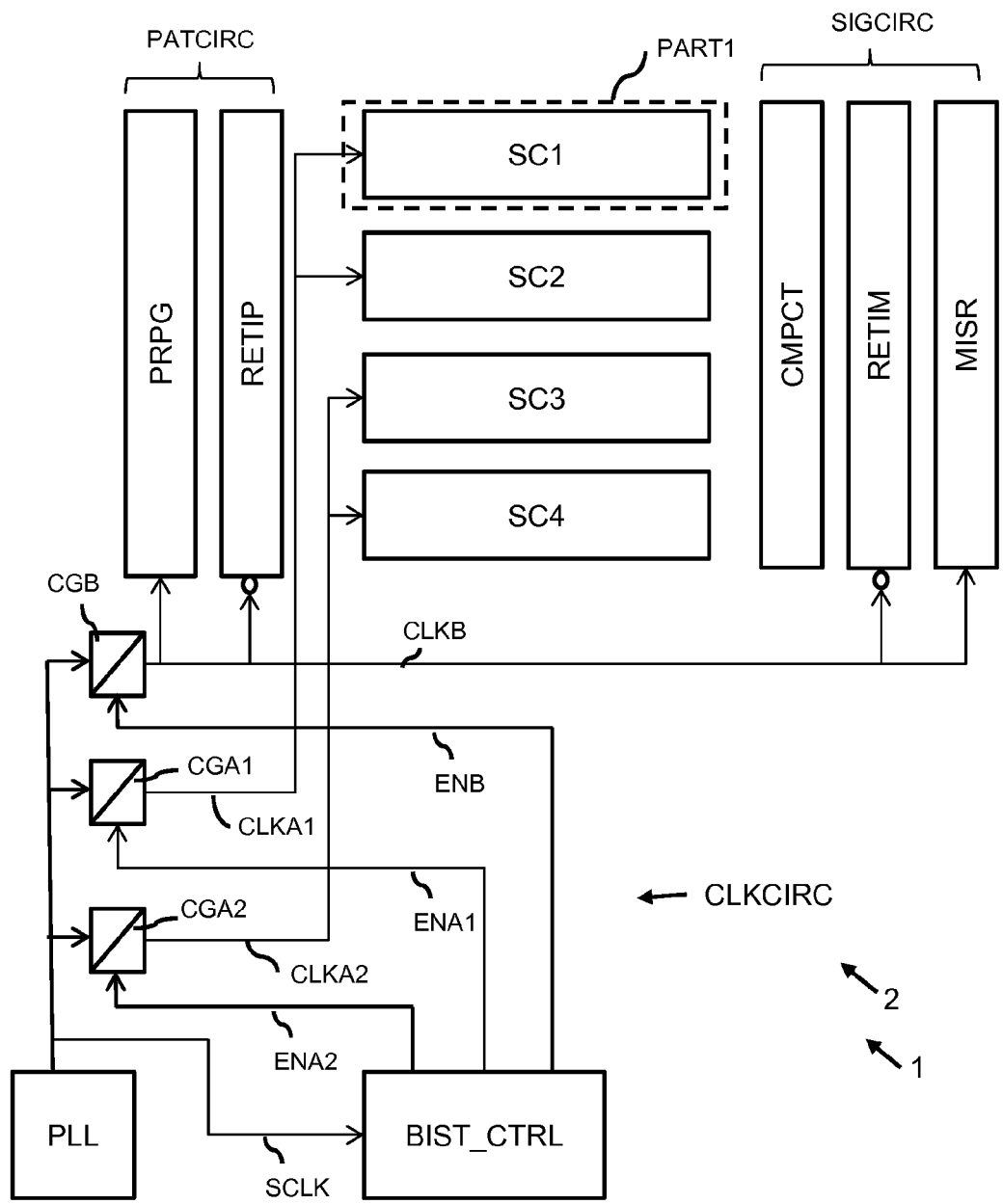
Figure 3:
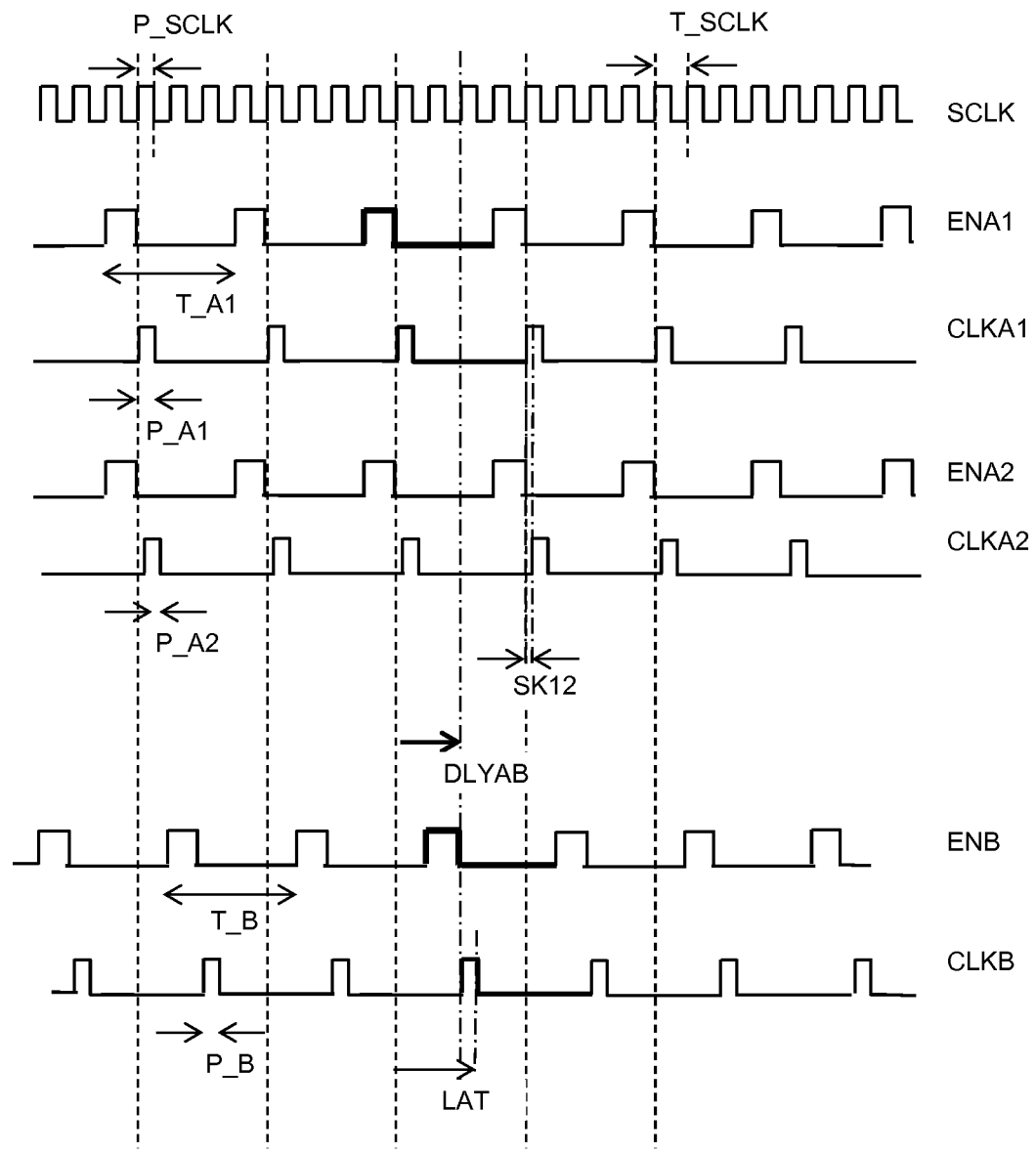
FIG. 3 schematically shows waveforms associated with an example.

FIG. 1 and FIG. 2 schematically show an example of an embodiment of a semiconductor device 1 comprising a circuit arrangement 2 for Logic Built-In Self-Test (LBIST) of the semiconductor device. FIG. 1 schematically shows a data architecture of the circuit arrangement 2 associated with operation in the scan phase. FIG. 2 schematically shows a clock architecture of the circuit arrangement 2. FIG. 3 schematically shows exemplary waveforms associated with operating the circuit arrangement.

The circuit arrangement 2 shown in FIG. 1 and FIG. 2 comprises a pattern generation circuitry PATCIRC, a plurality of scan chains SC1, SC2, SC3, SC4, a signature generation circuitry SIGCIRC, a clock circuitry CLKCIRC and a BIST controller BIST_CTRL.

The pattern generation circuitry PATCIRC comprises a pseudo-random pattern generator PRPG and a sequential pattern retiming element RETIP.

Each of the scan chains SC1, SC2, SC3, SC4 is part of a functional partition, which is indicated for the first scan chain SC1 with functional partition PART1 and an explicit indication of its functional circuit FC1. The double-headed arrows between the first scan chain SC1 and the functional circuit FC1 indicate that functional circuit FC1 can, in a capture phase, access test data loaded in the first scan chain SC1 and capture responses back into the scan chain.

The signature generation circuitry SIGCIRC comprises a compacting logic CMPCT, a sequential retiming element RETIM and a Multi-Input Signature Register MISR. The clock circuitry CLKCIRC comprises a clock source configured to generate a system clock SCLK having a system clock pulse duration P_SCLK and a system clock period T_SCLK, as indicated in FIG. 3.

The clock source may be a Phase-Locked Loop PLL, and uses without being limited to the clock source necessarily being a PLL—the acronym PLL as reference sign in FIG. 2. The system clock SCLK is derived to provide a system clock frequency corresponding to the fastest functional frequency of all functional partitions. The system clock may for example be in a range of 10 MHz 1 GHz, for example in a range of 20 MHz 500 MHz, such as for example 100 MHz or 200 MHz. Throughout this description, a non-limiting example will be used wherein the functional partitions associated with scan chains SC1 and SC2 have a functional frequency of 200 MHz, and wherein the functional partitions associated with scan chains SC3 and SC3 have a functional frequency of 50 MHz.

The BIST controller BIST_CTRL is configured to control all blocks shown. The BIST controller BIST_CTRL may herein operate at system clock speed during the capture phase of Logic Built-In Self-Test, to selectively supply at-speed capture pulses to the partitions, such as partition PART1. The BIST controller BIST_CTRL may operate the scan chains at a lower frequency in the scan phase, to hereby reduce the power consumption. The frequency used to operate the scan chains may be referred to as the shift frequency. Throughout this description, a non-limiting example will be used wherein the shift frequency is 50 MHz. The BIST controller BIST_CTRL cooperates with the clock circuitry CLKCIRC to form clock division circuitry. The clock division circuitry may hereby generate multiple clocks for different clock domains.

Figure 4:
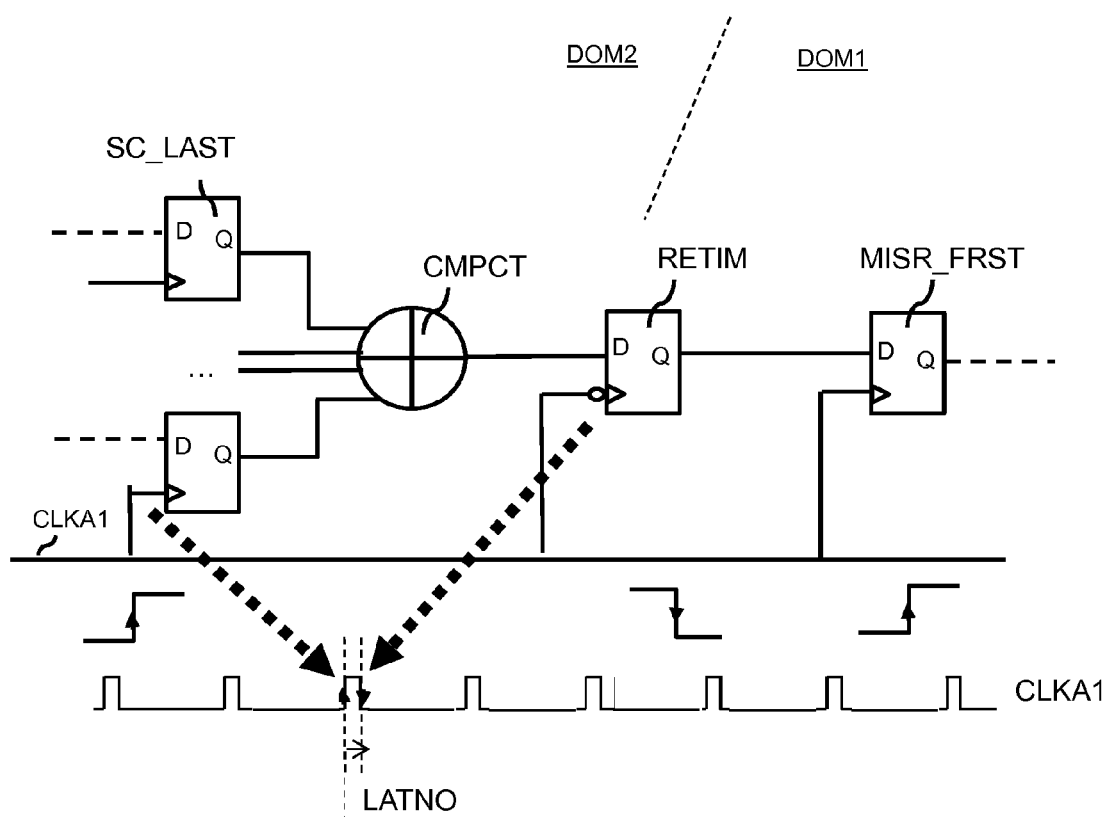
FIG. 4 and FIG. 5 schematically illustrate an operation of a circuit arrangement.
Figure 5:
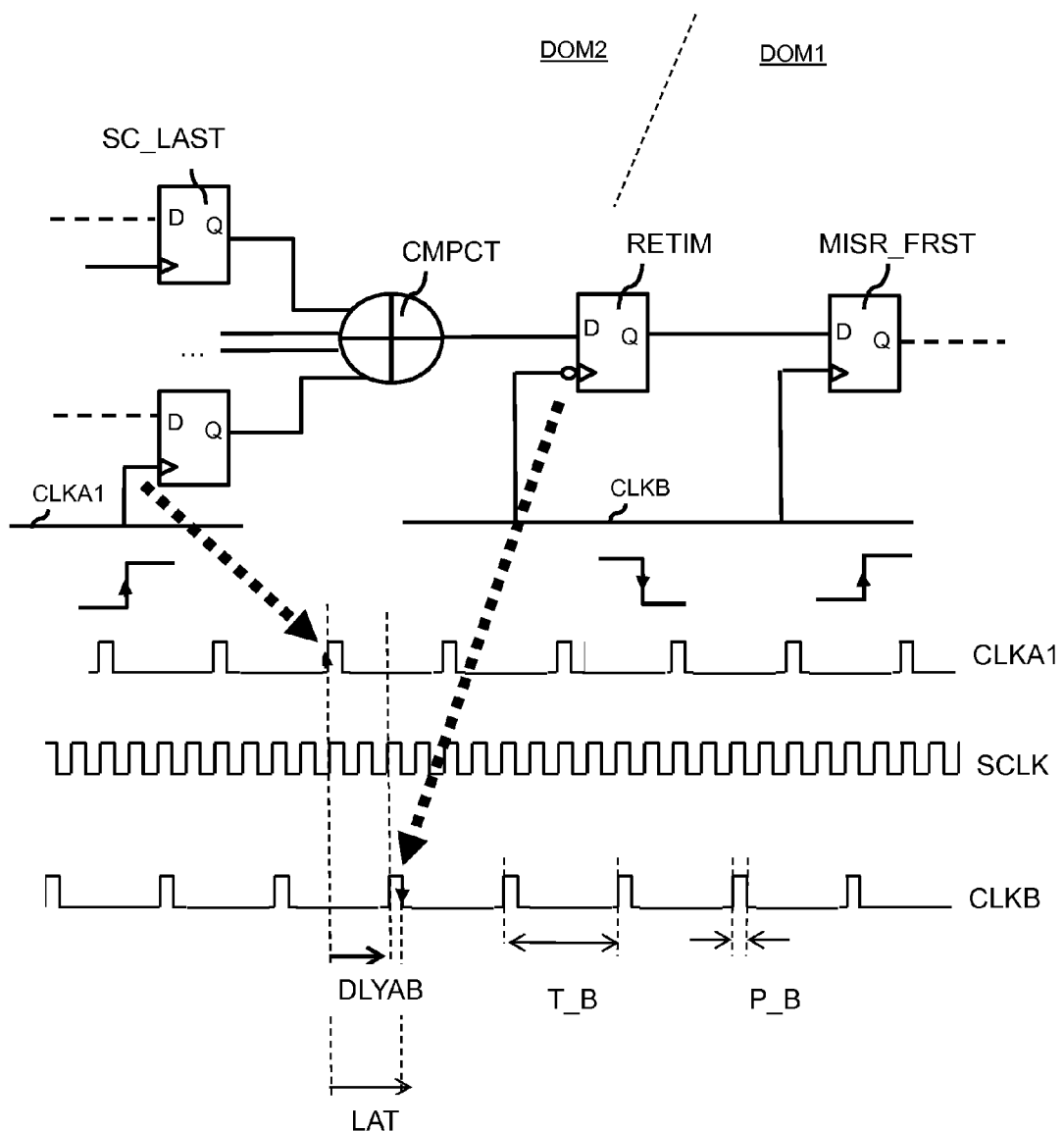

The sequential pattern retiming element RETIP and the sequential retiming element RETIM provide interfaces between the different clock domains: the PRPG and MISR are in one domain (referred to in FIG. 4 and FIG. 5 as DOM1) and the scan chains are in another domain (referred to in FIG. 4 and FIG. 5 as DOM2). Moreover may the different scan chains SC1, SC2, SC3, SC4 be in different clock domains. The sequential pattern retiming element RETIM may for example comprise negative-edge triggered flip-flops between the PRPG and the scan chains to provide a stable data stream across the domain boundary at the input side of the scan chains. The sequential retiming element RETIM may for example comprise a negative-edge triggered flip-flop, between the scan chains and the MISR to provide a stable data stream across the domain boundary at the output side of the scan chains.

The clock source PLL is configured to generate a system clock SCLK having a system clock pulse duration P_SCLK and a system clock period T_SCLK, as indicated in FIG. 3.

The clock circuitry comprises a first clock division circuitry configured to derive a first punched-out clock CLKA1 from the system clock SCLK by periodically suppressing one or more successive clock pulses of the system clock to obtain the first punched-out clock having a pulse duration P_A1 corresponding to the system clock pulse duration and a cycle time T_A1 corresponding to a plurality of system clock periods. As shown in FIG. 2, the first clock division circuitry hereto comprises a first clock control element CGA1 configured to receive the system clock SCLK from the clock source PLL and a first enable signal ENA1 from the BIST controller BIST_CTRL. The first clock control element CGA1 is configured to derive the first punched-out clock CLKA1 from the system clock SCLK by gating the system clock with the first enable signal ENA1. An example is shown in FIG. 3, which indicates that a high clock enable signal level of the first enable signal ENA1 results in a presence of a clock pulse of the first punched-out clock CLKA1 in the next period of the system clock SCLK, whereas a low clock enable signal level of the first enable signal ENA1 results in a suppression of clock pulses of the first punched-out clock CLKA1 in the next period of the system clock SCLK. The first punched-out clock is used for operating scan chains SC1 and SC2. Each scan chain SC1, SC2 has an associated output circuitry SC_LAST (shown to FIG. 4 and FIG. 5) responsive to a leading edge of the first punched-out clock CLKA1. As shown in FIG. 5, the output circuitry SC_LAST of the scan chains may comprise a first leading-edge triggered D-flip-flop SC_LAST for being responsive to the leading edge of the first punched-out clock CLKA1, such as a first positive-edge triggered D-flip-flop when the leading edge is a positive edge. Throughout this description, a non-limiting example will be used wherein the first punched-out clock has a frequency of 50 MHz.

The clock circuitry may comprise a further clock division circuitry configured to derive a further punched-out clock CLKA2 from the system clock SCLK by periodically suppressing one or more successive clock pulses of the system clock corresponding to the suppressed clock pulses in deriving the first punched-out clock CLKA1. Thus, the further punched-out clock CLKA2 is designed to be substantially synchronized in frequency and phase with the first punched-out clock, but implementation effects may result in a slight skew SK12 as is indicated in FIG. 3. The further punched-out clock may be used for operating a further plurality of scan chains SC3 and SC4. Each of the scan chains SC3, SC4 has an associated output circuitry responsive to a leading edge of the further punched-out clock CLKA2.

The clock circuitry further comprises a second clock division circuitry configured to derive a second punched-out clock CLKB from the system clock SCLK by periodically suppressing one or more successive clock pulses of the system clock to obtain the second punched-out clock CLKB with a pulse duration P_B corresponding to the system clock pulse duration and a cycle time T_B corresponding to the cycle time T_A1 of the first punched-out clock. Herein, the second punched-out clock CLKB is generated to have a delay DLYAB of one or more system clock periods relative to the first punched-out clock. The second punched-out clock is thus generated as a delayed version of the first punched-out clock. The second punched-out clock may also be referred to as delayed punched-out clock. As shown in FIG. 2, the second clock division circuitry hereto comprises a second clock control element CGB configured to receive the system clock SCLK from the clock source PLL and a second enable signal ENB from the BIST controller BIST_CTRL. The second clock division circuitry may be configured to derive the second punched-out clock CLKB from the system clock SCLK by gating the system clock with the second enable signal ENB. An example is shown in FIG. 3, which indicates that a high clock enable signal level of the second enable signal ENB results in a presence of a clock pulse of the second punched-out clock CLKB in the next period of the system clock SCLK, whereas a low clock enable signal level of the second enable signal ENB results in a suppression of clock pulses of the second punched-out clock CLKB in the next period of the system clock SCLK. The second punched-out clock is used for operating the PRPG, the sequential pattern retiming element RETIP, the sequential retiming element RETIM and the MISR. Throughout this description, a non-limiting example will be used wherein the delay DLYAB corresponds to two cycles of the system clock SCLK and the cycle times T_A1 and T_B correspond to four cycles of the system clock SCLK.

Figure 8:
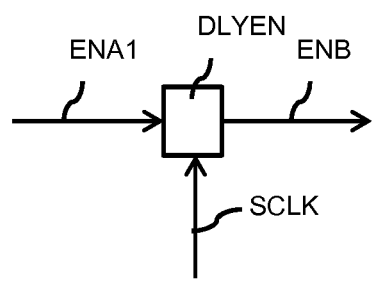
FIG. 8 schematically shows an element of an example.

The second clock division circuitry may comprise a delay element DLYEN configured to receive the system clock SCLK and the first enable signal ENA1 and to establish the second enable signal ENB from delaying the first enable signal ENA1 with one or more successive clock cycles of the system clock SCLK, to hereby provide the second enable signal ENB with a delay relative to the first enable signal ENA corresponding to the delay DLYAB. The delay element DLYEN may be part of the BIST controller BIST_CTRL, or a separate element. An example of delay element DLYEN is schematically shown in FIG. 8.

The signature generation circuitry SIGCIRC comprises the compacting logic CMPCT, the sequential retiming element RETIM and the Multi-Input Signature Register MISR. The signature generation circuitry SIGCIRC is operable at the second punched-out clock CLKB. As the second punched-out clock CLKB has a cycle time T_B that is equal to the cycle time T_A1 of the first punched-out clock, the signature generation circuitry operates at the same frequency as the scan chains. As the cycle time T_B of the second punched-out clock is larger than the period T_SCLK of the system clock SCLK, the signature generation circuitry operates a frequency lower than the frequency of the system clock SCLK. The compacting logic CMPCT itself is combinatorial logic, i.e., is not clocked.

The Multi-Input Signature Register MISR is operable at the second punched-out clock CLKB. The MISR has an input circuitry MISR_FRST responsive to a leading edge of the second punched-out clock CLKB. As shown In FIG. 5, the input circuitry MISR_FRST of the MISR may comprise a second leading-edge triggered D-flip-flop MISR_FRST for being responsive to the leading edge of the second punched-out clock CLKB, such as a second positive-edge triggered D-flip-flop when the leading edge is a positive edge.

The compacting logic CMPCT has a plurality of compactor inputs connected to the output circuitries SC_LAST of the plurality of scan chains SC1, SC2 (and SC3, SC4) and a compactor output. The compacting logic CMPCT is configured to compact signals provided to its inputs into a compacted output on its output. The compacting logic CMPCT may for example comprise an XOR tree.

The sequential retiming element RETIM is connected with its data input to the output of the compacting logic CMPCT. The sequential retiming element RETIM is connected with its data output to the input circuitry MISR_FRST of the MISR. The sequential retiming element RETIM is operable at the second punched-out clock CLKB, wherein the data input of the sequential retiming element RETIM is responsive to a trailing edge of the second punched-out clock CLKB. As shown in FIG. 5, the sequential retiming element RETIM may comprises a trailing-edge triggered D-flip-flop for being responsive to the trailing edge of the second punched-out clock CLKB, such as a negative-edge triggered D-flip-flop when the trailing edge is a negative edge. The data output of the sequential retiming element RETIM thus changes value at the trailing edge of the second punched-out clock CLKB.

According to an example, the cycle time P_A1 of the first punched-out clock and the cycle time P_B of the second punched-out clock correspond to an even number, N, of system clock periods and the delay DLYAB corresponds to half of the even number of system clock periods, i.e. to N/2 system clock periods. Hereby, the delay corresponds to substantially half of the cycle period of the second punched-out clock. The even number may for example be 2, 4, 6 or 8, such as 4.

According to another example, the cycle time P_A1 of the first punched-out clock and the cycle time P_B of the second punched-out clock correspond to an odd number, M, of system clock periods, the odd number being equal or larger than three, and the delay DLYAB corresponds to half of the odd number minus one of system clock periods, i.e. $(M-1)/2$, or half of the odd number plus one of system clock periods, i.e. $(M+1)/2$. The odd number may for example be 3, 5, 7 or 9.

Hereby, the delay may correspond to approximately half of the cycle period of the second punched-out clock.

FIG. 4 and FIG. 5 schematically illustrate an operation of a circuit arrangement. FIG. 4 shows an comparative example where the sequential retiming element RETIM and the input circuitry MISR_FRST of the Multi-Input Signature Register MISR are operated using the same punched-out clock CLKA1 as the output circuitry SC_LAST of the scan chains. The output circuitry SC_LAST is connected via compacting logic CMPCT in the form of an XOR tree to the sequential retiming element RETIM, which is connected to the MISR. The output circuitry SC_LAST comprises a positive-edge triggered D-flip-flop, as indicated by the associated upward arrows. The sequential retiming element RETIM comprises a negative-edge triggered D-flip-flop, as indicated by the associated downward arrows. The input circuitry MISR_FRST comprises a positive-edge triggered D-flip-flop, as indicated by the associated upward arrows. The inventors have found that the comparative circuit may operate well at relatively low system clock frequencies, but that problems may arise when operating at higher frequencies. For example, where the punched-out clock is derived from a 200 MHz system clock SCLK by suppressing three of each four clock pulses, the pulse duration of the punched-out clock is thus 2.5 ns and the cycle time is 20 ns. The relatively short pulse duration of the punched-out clock may in the comparative example require strong timing requirements on the compacting logic CMPCT, e.g., as its transition delay or latency, indicated with arrow LATNO, must smaller than the pulse duration to be able to correctly sample its output by the sequential retiming element RETIM.

FIG. 5 shows an example where the output circuitry SC_LAST of the scan chains is operated with the first punched-out clock CLKA1 and the sequential retiming element RETIM and the input circuitry MISR_FRST of the Multi-Input Signature Register MISR are operated with the second punched-out clock CLKB. In the example, both punched-out clocks are again derived from a 200 MHz system clock SCLK by suppressing three of each four clock pulses, the pulse duration of the punched-out clocks is thus 2.5 ns and their cycle time is 20 ns. The second punched-out clock CLKB is delayed relative to the first punched-out clock with two cycles of the system clock SCLK, i.e. with 10 ns, indicated with arrow DLYAB. Hereby, timing requirements to the comparator logic and/or skew requirements may be relaxed. For example, the maximum transition delay or latency of the compacting logic CMPCT may (ignoring skew for simplicity) now correspond to a duration from the positive edge of the first punched-out clock CLKA1 to the negative edge of the second punched-out clock, as indicated with arrow LAT.

The inventors have thus found that, although the divided down shift clocks (i.e., the first punched-out clock and the second punched-out clock) created by punch-out clock division may be advantageous for power reduction reasons due to its increased cycle time relative to the fast system clock from which is it derived, the punched-out clock may result in some complications in some parts of circuit design due to its relatively short pulse duration. As discussed above when reference the comparative example, when the inputs of an XOR tree used to compact the shifted out data connect to the positive-edge clocked outputs of the multiple scan chains and the output of the XOR tree connects to a negative-edge clocked retiming flip-flop, the relatively narrow pulse width imposes strong timing requirements on the data path through the XOR tree.

According to an example, the scan chains are clocked with a first punched-out clock derived from the system clock by periodically suppressing one or more successive clock pulses of the system clock, an second punched-out clock is obtained from delaying the first punched-out clock with a delay of one or more clock pulses of the system clock, and the retiming flip-flop is clocked with the second punched-out clock. Hereby, clock skew between the multiple scan chains and/or a transition delay across the XOR tree may be relaxed. The design of the semiconductor device may hereby be facilitated.

In an example, the delay of one or more clock pulses corresponds to half the cycle time of the first punched-out clock, where the cycle time corresponds to an even number of clock periods of the system clock. In an example, the cycle time of the punched-out clock corresponds to 4 clock pulses of the system clock, and the delay corresponds to 2 clock pulses.

As shown in FIG. 1 and FIG. 2, the circuit arrangement 2 may further comprise a pattern generation circuitry PATCIRC comprising a pseudo-random pattern generator PRPG and a sequential pattern retiming element RETIP. The pseudo-random pattern generator PRPG is operable at the second punched-out clock CLKB. The pseudo-random pattern generator PRPG has an output circuitry (not shown) responsive to a leading edge of the second punched-out clock CLKB. The output circuitry of the PRPG may comprise a leading-edge triggered D-flip-flop for being responsive to the leading edge of the second punched-out clock CLKB. The PRPG is configured to generate test stimuli to be shifted into the scan chains (for use in the capture phase by the functional partitions). Hereto, each scan chain has an associated input circuitry (not shown) responsive to a leading edge of the first punched-out clock CLKA1. The input circuitry of the scan chains may comprise a leading-edge triggered D-flip-flop for being responsive to the leading edge of the first punched-out clock CLKA. The sequential pattern retiming element RETIP is connected with its inputs to the output circuitry of the pseudo-random pattern generator PRPG and connected with its outputs to the input circuitry of the associated scan chains SC1, SC2. The sequential pattern retiming element RETIP is operable at the second punched-out clock CLKB. The inputs of the sequential pattern retiming element RETIP are responsive to a trailing edge of the second punched-out clock CLKB. The inputs of the sequential pattern retiming element RETIP may comprise respective trailing-edge triggered D-flip-flops for being responsive to the trailing edge of the second punched-out clock CLKB. The pattern generation circuitry PATCIRC and the signature generation circuitry SIGCIRC may hereby be operated in a single same clock domain.

Methods of operating examples of the circuit arrangement 2 for Logic Built-In Self-Test LBIST may comprise operating the clock source PLL to generate a system clock SCLK having a system clock pulse duration P_SCLK and a system clock period T_SCLK.

The method may further comprise operating the first clock division circuitry to derive a first punched-out clock CLKA1 from the system clock SCLK by periodically suppressing one or more successive clock pulses of the system clock to obtain the first punched-out clock having a pulse duration P_A1 corresponding to the system clock pulse duration and a cycle time T_A1 corresponding to a plurality of system clock periods. The method may further comprise operating the plurality of scan chains SC1, SC2 at the first punched-out clock CLKA1, each scan chain having an associated output circuitry SC_LAST responsive to a leading edge of the first punched-out clock CLKA1. The method may further comprise operating the second clock division circuitry to derive a second punched-out clock CLKB from the system clock SCLK by periodically suppressing one or more successive clock pulses of the system clock to obtain the second punched-out clock CLKB with a pulse duration P_B corresponding to the system clock pulse duration and a cycle time T_B corresponding to the cycle time T_A1 of the first punched-out clock, with the second punched-out clock (CLKB) having a delay (DLYAB) of one or more system clock periods relative to the first punched-out clock. The method may further comprise letting the compacting logic CMPCT receive signals from the output circuitries SC_LAST of the plurality of scan chains SC1, SC2 at its inputs and compact the signals provided to its inputs into a compacted output on its output. The method may further comprise operating the sequential retiming element RETIM at the second punched-out clock CLKB to receive the compacted output from the compacting logic on the data input of the sequential retiming element RETIM in response to a trailing edge of the second punched-out clock CLKB. The method may further comprise operating the Multi-Input Signature Register MISR at the second punched-out clock CLKB to receive the compacted output from the data output of the sequential retiming element RETIM on the input circuitry MISR_FRST of the Multi-Input Signature Register MISR in response to a leading edge of the second punched-out clock CLKB. Operating the first clock division circuitry to derive the first punched-out clock CLKA1 from the system clock SCLK may comprise generating a first enable signal ENA1 and gating the system clock with the first enable signal ENA1. Operating the second clock division circuitry to derive the second punched-out clock CLKB from the system clock SCLK may comprise generating a second enable signal ENB and gating the system clock with the second enable signal ENB. Generating the second enable signal ENB may comprise establishing the second enable signal ENB from delaying the first enable signal ENA1 with successive clock cycles of the system clock SCLK. The method may further operating the further clock division circuitry to derive a further punched-out clock CLKA2 from the system clock SCLK by periodically suppressing one or more successive clock pulses of the system clock corresponding to the suppressed clock pulses in deriving the first punched-out clock CLKA1, and operating the further plurality of scan chains SC3, SC4 at the further punched-out clock, each scan chain of the further plurality of scan chains having an associated output circuitry responsive to a leading edge of the further punched-out clock CLKA2, wherein the scan chains SC3, SC4 of the further plurality of scan chains are connected to the compacting logic CMPCT.

The method may further comprise operating the pseudo-random pattern generator PRPG at the second punched-out clock CLKB to provide test patterns on its output circuitry in response to a leading edge of the second punched-out clock CLKB. The PRPG hereby generates test stimuli to be shifted into the scan chains for use used in the capture phase by the functional partitions. The method may further comprise operating the sequential pattern retiming element RETIP at the second punched-out clock CLKB to receive the test patterns from the pseudo-random pattern generator PRPG on the inputs of the sequential pattern retiming element RETIP in response to a trailing edge of the second punched-out clock CLKB. The method may further comprise operating the scan chains to receive the test patterns from the sequential pattern retiming element RETIP on associated input circuitry in response to a leading edge of the first punched-out clock CLKA1.

Figure 6:
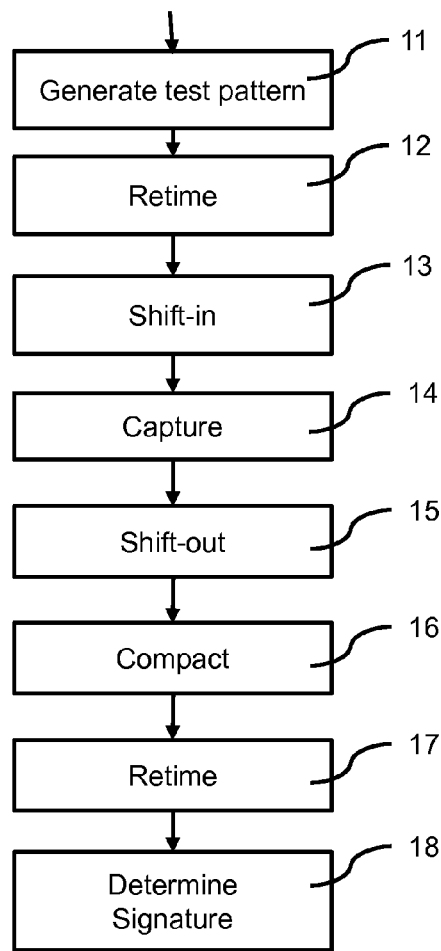
FIG. 6 and FIG. 7 schematically illustrate an example of LBIST testing.
Figure 7:
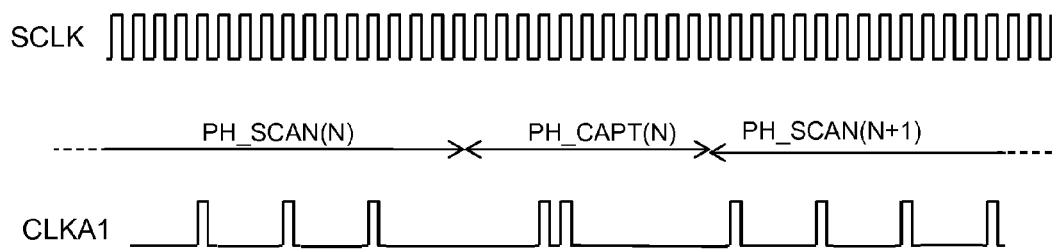

A method of performing a Logic Built-In Self-Test of a semiconductor device may comprise performing the above described method in scan phases and performing at-speed capture in capture phases. An example is shown in FIG. 6 and FIG. 7. The method may be performed by the semiconductor device having a circuit arrangement 2 for Logic Built-In Self-Test according to an example, operated to derive a first punched-out clock and a second punched-out clock from a system clock.

FIG. 6 and FIG. 7 illustrate a LBIST method comprising a first action 11 of generating test patterns by a PRPG using the second punched-out clock. In action 12, the test patterns are retimed using the sequential pattern retiming element RETIP. Action 13 shifts the generated test patterns, after being retimed, into the scan chains. Actions 11, 12 and 13 are performed in scan phase PH_SCAN(N). After actions 11, 12 and 13 have fully loaded the scan chains, a capture phase PH_CAPT is executed 14 wherein at-speed capture pulses are applied to the respective functional partitions. FIG. 7 schematically shows that the at-speed capture pulses are provided at a high-frequent functional domain at the system clock speed. Capture pulses may be provided at lower frequencies to functional domains operative at lower functional frequencies. In the capture phase PH_CAPT, the respective functional partitions operate on the generated test patterns. The response of the partitions to the test patterns is captured in the associated scan chains. The at-speed capture pulses may be derived from the system clock using clock gating with suitably generated clock enable signals (by the LBIST controller BIST_CTRL), e.g., using the first clock control element CGA1 and the clock enable signal ENA1 for this purpose during the capture phase. After the capture phase is completed, action 15 shifts the responses out of the scan chain into the compacting logic. In action 16, the compacting logic recodes the responses into compacted response. Action 17 retimes the response, and the retimed response is used by the MISR to determine a signature in action 18. Actions 15, 16, 17 and 18 are performed in scan phase PH_SCAN(N+1). The signature may then be made available for further analysis, such as comparison with a reference signature associated with expected responses to determine whether the digital circuitry behaved fault-free. Shifting of test data into the circuitry and shifting of responses out of the scan chain may be done simultaneously. A Built-In Self-Test (BIST) of a digital circuitry may also be referred to as Logic Built-In Self-Test (LBIST). The scan phase may also be referred to as shift phase.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

Figure 9:
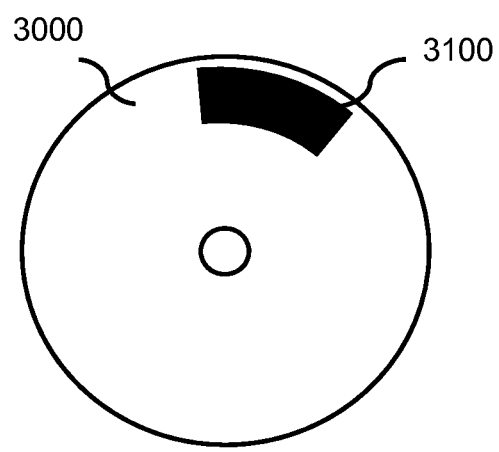
FIG. 9 schematically a computer readable medium comprising a computer program product

As an example, FIG. 9 shows a computer readable medium 3000 comprising a computer program product 3100, the computer program product 3100 comprising instructions for causing a processor apparatus to perform a method according to an example. The computer program product 3100 may be embodied on the computer readable medium 3000 as physical marks or by means of magnetization of the computer readable medium 3000. However, any other suitable embodiment is conceivable as well. Furthermore, it will be appreciated that, although the computer readable medium 3000 is shown in FIG. 9 as an optical disc, the computer readable medium 3000 may be any suitable computer readable medium, such as a hard disk, solid state memory, flash memory, etc., and may be non-recordable or recordable.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A circuit arrangement for Logic Built-In Self-Test (LBIST) of a semiconductor device, the circuit arrangement comprising:

a clock source configured to generate a system clock having a system clock pulse duration and a system clock period;

a first clock division circuitry configured to derive a first punched-out clock from the system clock by periodically suppressing one or more successive clock pulses of the system clock to obtain the first punched-out clock having a pulse duration corresponding to the system clock pulse duration and a cycle time corresponding to a plurality of system clock periods;

a plurality of scan chains operable at the first punched-out clock, each scan chain having an associated output circuitry responsive to a leading edge of the first punched-out clock;

a second clock division circuitry configured to derive a second punched-out clock from the system clock by periodically suppressing one or more successive clock pulses of the system clock to obtain the second punched-out clock with a pulse duration corresponding to the system clock pulse duration and a cycle time corresponding to the cycle time of the first punched-out clock, the second punched-out clock having a delay of one or more system clock periods relative to the first punched-out clock;

a signature generation circuitry comprising a compacting logic, a sequential retiming element and a Multi-Input Signature Register;

the Multi-Input Signature Register being operable at the second punched-out clock, the Multi-Input Signature Register having an input circuitry responsive to a leading edge of the second punched-out clock;

the compacting logic having a plurality of compactor inputs connected to the output circuitries of the plurality of scan chains and a compactor output, and configured to compact signals provided to its inputs into a compacted output on its output;

the sequential retiming element being connected with a data input to the output of the compacting logic and connected with a data output to the input circuitry of the Multi-Input Signature Register;

the sequential retiming element being operable at the second punched-out clock, the data input of the sequential retiming element being responsive to a trailing edge of the second punched-out clock.

2. A circuit arrangement according to claim 1, the first clock division circuitry comprising a first clock control element configured to receive the system clock and a first enable signal, and to derive the first punched-out clock from the system clock by gating the system clock with the first enable signal.

3. A circuit arrangement according to claim 2, the second clock division circuitry comprising a second clock control element configured to receive the system clock and a second enable signal, and to derive the second punched-out clock from the system clock by gating the system clock with the second enable signal.

4. A circuit arrangement according to claim 3, the second clock division circuitry comprising a delay element configured to receive the system clock and the first enable signal and to establish the second enable signal from delaying the first enable signal with one or more successive clock cycles of the system clock.

5. A circuit arrangement according to claim 1, further comprising:
a further clock division circuitry configured to derive a further punched-out clock from the system clock by periodically suppressing one or more successive clock pulses of the system clock corresponding to the suppressed clock pulses in deriving the first punched-out clock; and
a further plurality of scan chains, each scan chain of the further plurality of scan chains having an associated output circuitry responsive to a leading edge of the further punched-out clock, the scan chains of the further plurality of scan chains being connected to the compacting logic.

6. A circuit arrangement according to claim 1, further comprising:
a pattern generation circuitry comprising a pseudo-random pattern generator and a sequential pattern retiming element;
the pseudo-random pattern generator being operable at the second punched-out clock, the pseudo-random pattern generator having an output circuitry responsive to a leading edge of the second punched-out clock;
each scan chain having an associated input circuitry responsive to a leading edge of the first punched-out clock;
the sequential pattern retiming element being connected with its inputs to the output circuitry of the pseudo-random pattern generator and connected with its outputs to the input circuitry of the associated scan chains;
the sequential pattern retiming element being operable at the second punched-out clock, the inputs of the sequential pattern retiming element being responsive to a trailing edge of the second punched-out clock.

7. A circuit arrangement according to claim 1, wherein the cycle time of the first punched-out clock and the cycle time of the second punched-out clock correspond to an even number of system clock periods and the delay corresponds to half of the even number of system clock periods.

8. A circuit arrangement according to claim 7, wherein the even number is 2, 4, 6 or 8.

9. A circuit arrangement according to claim 1, wherein the cycle time of the first punched-out clock and the cycle time of the second punched-out clock correspond to an odd number of system clock periods, the odd number being equal or larger than three, and the delay corresponds to half of the odd number minus one of system clock periods or half of the odd number plus one of system clock periods.

10. A circuit arrangement according to claim 1, wherein
the output circuitry of the scan chains comprises a first leading-edge triggered D-flip-flop for being responsive to the leading edge of the first punched-out clock,
the sequential retiming element comprises a trailing-edge triggered D-flip-flop for being responsive to the trailing edge of the second punched-out clock, and
the input circuitry of the Multi-Input Signature Register comprises a second leading-edge triggered D-flip-flop for being responsive to the leading edge of the second punched-out clock.

11. A semiconductor device comprising a circuit arrangement according to claim 1.

12. A method of operating a circuit arrangement for Logic Built-In Self-Test of a semiconductor device claim 1, the method comprising:
operating a clock source to generate a system clock having a system clock pulse duration and a system clock period;
operating first clock division circuitry to derive a first punched-out clock from the system clock by periodically suppressing one or more successive clock pulses of the system clock to obtain the first punched-out clock having a pulse duration corresponding to the system clock pulse duration and a cycle time corresponding to a plurality of system clock periods;
operating a plurality of scan chains at the first punched-out clock, each scan chain having an associated output circuitry responsive to a leading edge of the first punched-out clock;
operating second clock division circuitry to derive a second punched-out clock from the system clock by periodically suppressing one or more successive clock pulses of the system clock to obtain the second punched-out clock with a pulse duration corresponding to the system clock pulse duration and a cycle time corresponding to the cycle time of the first punched-out clock, the second punched-out clock having a delay of one or more system clock periods relative to the first punched-out clock;
receiving signals from the output circuitries of the plurality of scan chains at its inputs and compacting the signals provided into a compacted output;
operating a sequential retiming element at the second punched-out clock to receive the compacted output in response to a trailing edge of the second punched-out clock; and
operating a Multi-Input Signature Register at the second punched-out clock to receive the compacted output in response to a leading edge of the second punched-out clock.

13. A method according to claim 12, wherein operating the first clock division circuitry to derive the first punched-out clock from the system clock comprises generating a first enable signal and gating the system clock with the first enable signal.

14. A method according to claim 13, wherein operating the second clock division circuitry to derive the second punched-out clock from the system clock comprises generating a second enable signal and gating the system clock with the second enable signal.

15. A method according to claim 14, wherein generating the second enable signal comprises establishing the second enable signal from delaying the first enable signal with successive clock cycles of the system clock.

16. A method according to claim 12, the method further comprising:
   operating further clock division circuitry to derive a further punched-out clock from the system clock by periodically suppressing one or more successive clock pulses of the system clock corresponding to the suppressed clock pulses in deriving the first punched-out clock; and
   operating the further plurality of scan chains the further punched-out clock, each scan chain of the further plurality of scan chains having an associated output circuitry responsive to a leading edge of the further punched-out clock.

17. A method according to claim 12, the method further comprising:
   operating a pseudo-random pattern generator at the second punched-out clock to provide test patterns in response to a leading edge of the second punched-out clock;
   operating the sequential pattern retiming element at the second punched-out clock, to receive the test patterns from the pseudo-random pattern generator in response to a trailing edge of the second punched-out clock; and
   operating the scan chains to receive the test patterns from the sequential pattern retiming element on associated input circuitry in response to a leading edge of the first punched-out clock.

* * * * *